United States Patent
Kao

(10) Patent No.: US 8,461,646 B2
(45) Date of Patent: Jun. 11, 2013

(54) TRENCH MOS BARRIER SCHOTTKY (TMBS) HAVING MULTIPLE FLOATING GATES

(75) Inventor: Lung-Ching Kao, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 140 days.

(21) Appl. No.: 13/021,078

(22) Filed: Feb. 4, 2011

(65) Prior Publication Data

US 2012/0199902 A1  Aug. 9, 2012

(51) Int. Cl.
*H01L 29/88* (2006.01)
*H01L 21/28* (2006.01)

(52) U.S. Cl.
USPC ....................................................... 257/331

(58) Field of Classification Search
USPC .................. 257/320, 328, 329, 270, 271, 341, 257/331, 301, E21.345, E29.133, E21.418, 257/E29.02, E29.066, E29.257, E21.419, 257/E29.121, E29.26, 330, 332, 923, E21.629, 257/E29.027, E29.146
See application file for complete search history.

(56) References Cited

U.S. PATENT DOCUMENTS

| | | | |
|---|---|---|---|
| 5,101,244 A | 3/1992 | Mori et al. | |
| 6,252,288 B1 | 6/2001 | Chang | |
| 6,351,018 B1 * | 2/2002 | Sapp | 257/499 |
| 6,677,641 B2 * | 1/2004 | Kocon | 257/329 |
| 6,764,889 B2 | 7/2004 | Baliga | |
| 6,846,729 B2 | 1/2005 | Andoh et al. | |
| 6,998,694 B2 | 2/2006 | Wu | |
| 7,638,841 B2 * | 12/2009 | Challa | 257/341 |
| 8,338,285 B2 * | 12/2012 | Dunn et al. | 438/589 |
| 2002/0125541 A1 | 9/2002 | Korec et al. | |
| 2003/0073287 A1 * | 4/2003 | Kocon | 438/259 |
| 2005/0189586 A1 | 9/2005 | Blanchard | |
| 2005/0199918 A1 | 9/2005 | Calafut et al. | |
| 2005/0275016 A1 * | 12/2005 | Qu | 257/342 |
| 2006/0214221 A1 * | 9/2006 | Challa et al. | 257/328 |
| 2008/0128775 A1 * | 6/2008 | Park | 257/314 |
| 2009/0039869 A1 | 2/2009 | Williams | |
| 2010/0044796 A1 | 2/2010 | Hshieh | |
| 2011/0018005 A1 * | 1/2011 | Nakano | 257/77 |
| 2011/0121386 A1 * | 5/2011 | Hsieh | 257/334 |
| 2011/0284954 A1 * | 11/2011 | Hsieh | 257/331 |

OTHER PUBLICATIONS

Wesley Hsu et al., "300-V TMBS Rectifier and the Termination Design", Vishay Semiconductor Taiwan, Sep. 30, 2009, 23 pages.

* cited by examiner

*Primary Examiner* — Doa H Nguyen
*Assistant Examiner* — Tram H Nguyen
(74) *Attorney, Agent, or Firm* — Mayer & Williams PC; Stuart H. Mayer; Karin L. Williams

(57) ABSTRACT

A semiconductor rectifier is provided which includes a semiconductor substrate having a first type of conductivity. An epitaxial layer is formed on the substrate. The epitaxial layer has the first type of conductivity and is more lightly doped than the substrate. A plurality of floating gates is formed in the epitaxial layer and a metal layer is disposed over the epitaxial layer to form a Schottky contact therebetween. A first electrode is formed over the metal layer and a second electrode is formed on a backside of the substrate.

14 Claims, 13 Drawing Sheets

TRENCH MOS BARRIER SCHOTTKY (TMBS) HAVING MULTIPLE FLOATING GATES

FIELD OF THE INVENTION

The present invention relates generally to a semiconductor device, and more particularly to a gate structure for a trench MOS device.

BACKGROUND

Conventionally, a Schottky diode includes a heavily-doped semiconductor substrate, typically made of single-crystal silicon. A second layer covers the substrate, The second layer, called the drift region, is less heavily-doped with a material having carriers of the same conducting type as the substrate. A metal layer or a metal silicide layer forms a Schottky contact with the lightly-doped drift region and forms the diode anode.

Two opposing constraints arise when forming a unipolar component such as a Schottky diode. In particular, the components should exhibit the lowest possible on-state resistance (Ron) while having a high breakdown voltage. Minimizing the on-state resistance imposes minimizing the thickness of the less doped layer and maximizing the doping of this layer. Conversely, to obtain a high reverse breakdown voltage, the doping of the less doped layer must be minimized and its thickness must be maximized, while avoiding the creation of areas in which the equipotential surfaces are strongly bent.

Various solutions have been provided to reconcile these opposite constraints, which has led to the development of trench MOS-capacitance Schottky diode structures, which are referred to as Trench MOS Barrier Schottky (TMBS) diodes. In an example of such structures, conductive areas, for example, heavily-doped N-type polysilicon areas, are formed in an upper portion of a thick drift region less heavily N-type doped than an underlying substrate. An insulating layer insulates the conductive areas from the thick layer. An anode layer covers the entire structure, contacting the upper surface of the insulated conductive areas and forming a Schottky contact with the lightly-doped drift region.

When reverse biased, the insulated conductive areas cause a lateral depletion of into the drift region, which modifies the distribution of the equipotential surfaces in this layer. This enables increasing the drift region doping, and thus reducing the on-state resistance with no adverse effect on the reverse breakdown voltage.

FIG. 1 is a simplified, partial view of a conventional TMBS Schottky diode or rectifier. The diode is formed from a heavily-doped N-type silicon wafer 1 on which is formed a lightly-doped N-type epitaxial layer 2. Openings are formed in this epitaxial layer, which may be, for example, trench-shaped. Conductive regions 3 are formed in the openings, which are made, for example, of doped polysilicon. An insulating layer 4 is interposed between each conductive region and the walls of the corresponding opening (e.g., trench). The insulating layer 4 may be formed, for example, by thermal oxidation and the opening may be filled with polysilicon by conformal deposition, followed by a planarization step. After this, a metal, for example, nickel, capable of forming a silicide 5 above the single-crystal silicon regions 6 above the polysilicon filling areas, is deposited. Once the silicide has been formed, the metal which has not reacted with the silicon is removed by selective etch. After this, an anode metal deposition 7 is formed on the upper surface side and a cathode metal deposition 8 is formed on the lower surface side.

The use of a trench structure instead of a planar structure creates about an additional 20V of blocking capability (for a trench that is about 2 microns in width). This increase results from the relocation of the peak electric field from the epitaxial layer surface to the bottom of trenches and redistribution of electric field in silicon. The significance of this additional blocking capability is reduced for higher blocking voltages. For example, 20V represents a 25% increase in blocking voltage for an 80V device but only represents an 11% increase for a 180V device.

SUMMARY OF THE INVENTION

In accordance with the present invention, a semiconductor rectifier is provided which includes a semiconductor substrate having a first type of conductivity. An epitaxial layer is formed on the substrate. The epitaxial layer has the first type of conductivity and is more lightly doped than the substrate. A plurality of floating gates is formed in the epitaxial layer and a metal layer is disposed over the epitaxial layer to form a Schottky contact therebetween. A first electrode is formed over the metal layer and a second electrode is formed on a backside of the substrate.

In accordance with another aspect of the invention, a method of fabricating a rectifier comprising is provided. The method includes providing a semiconductor body of a first conductivity type and etching a plurality of trenches in a surface of the semiconductor body so that a mesa remains between adjacent trenches. Each of the trenches has a sidewall and a bottom. A plurality of floating gates is formed in each of the trenches. A metal layer is formed on a surface of the mesa so that a Schottky contact is formed therewith.

DETAILED DESCRIPTION

As detailed below, the gate structure of a Trench MOS Barrier Schottky (TMBS) diode is modified in order to further relocate the peak electric field in the epitaxial layer of the device. In this way additional increases in blocking voltage can be achieved by the use of a trench design. In particular, instead of using a single gate design, a TMBS diode is provided which uses multiple floating gates. Such a device will be referred to herein from time to time as a Multiple Floating Gate TMBS (MFGTMBS). Through charge coupling and field crowding at the corner of each floating gate, multiple electric fields are created in the epitaxial layer of the device. This gives rise to a super junction-like electric field and results in a device with a higher blocking voltage capability because a more highly-doped epitaxial layer can be used.

Figure 1:
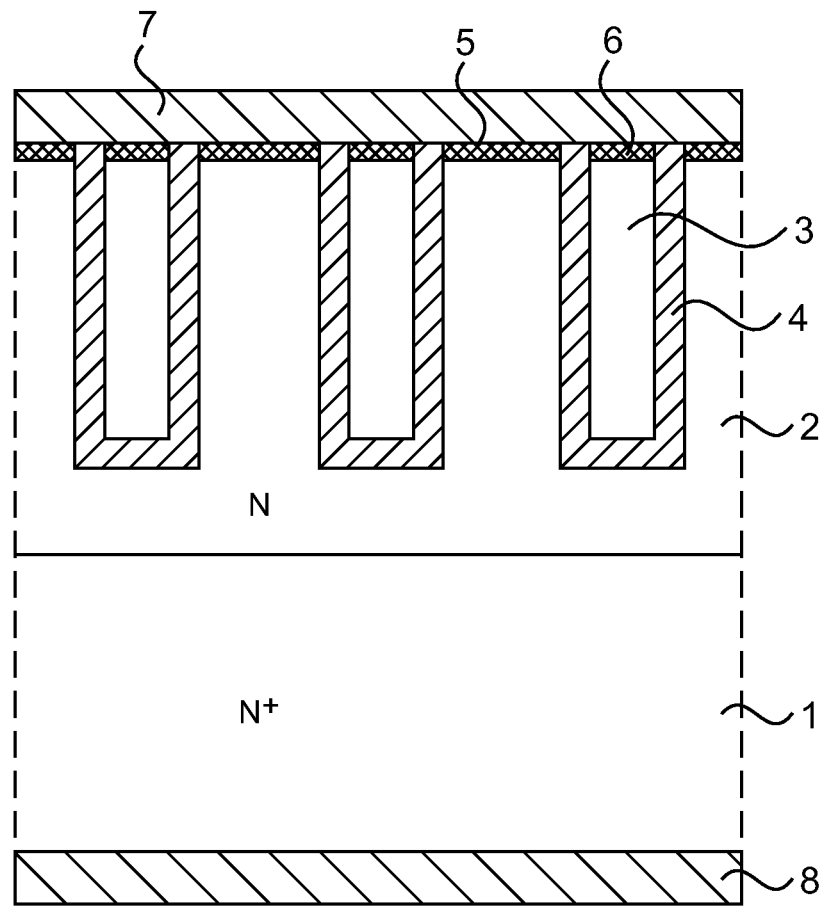
FIG. 1 is a simplified, partial view of a conventional TMBS Schottky diode or rectifier.
Figure 2:
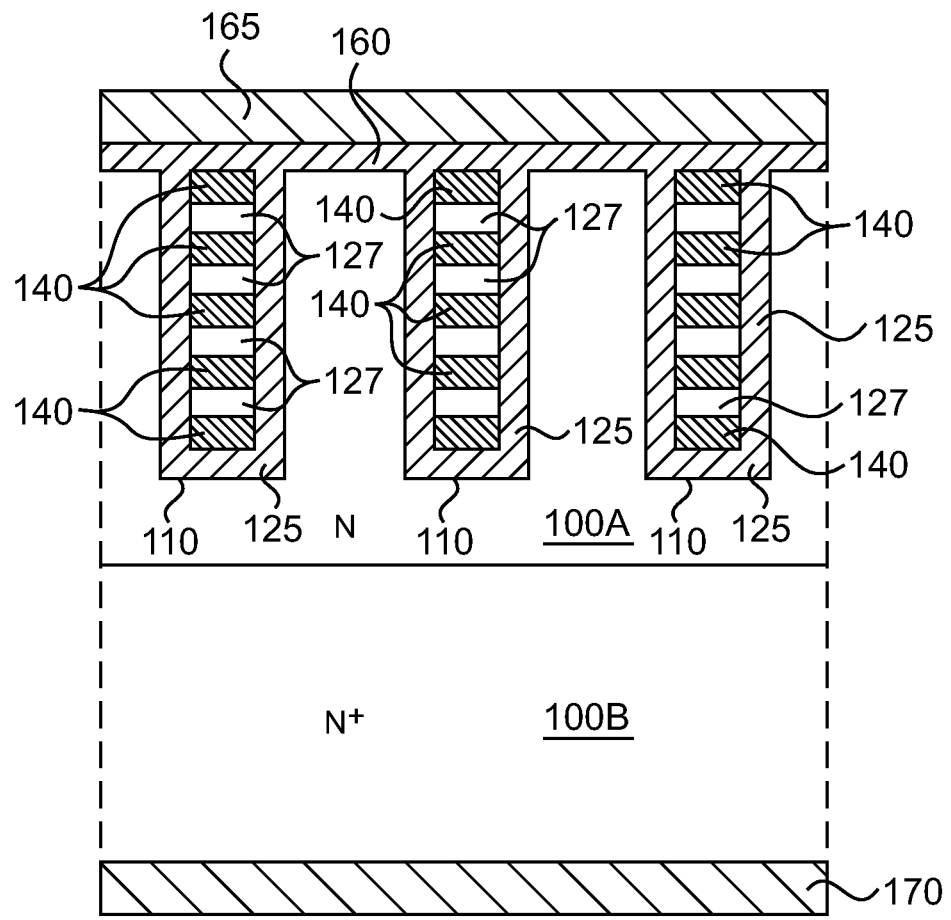
FIG. 2 shows a cross-sectional view of the active region of a MFGTMBS diode.

FIG. 2 shows a cross-sectional view of the active region of a MFGTMBS diode. The active region includes a semiconductor substrate 100B that is heavily doped with a dopant of a first conductivity type (e.g., n+ type). A first epitaxial layer 100A is formed on the substrate 100B and is more lightly doped with a dopant of the first conductivity type (e.g., n– type). One or more trenches 110 are formed in the first epitaxial layer 100A. The trenches 110 are lined with an insulating layer 125. The trenches 110 are filled with alternating layers 140 and 127 of a conductive material and an insulating material, respectively. Conductive layers 140 serve as floating gates 140 and may be formed from a conductive material such as a metal (e.g., aluminum) or doped polysilicon, for example. Insulating layer 127 may be formed from any suitable insulating material such as $SiO_2$, for example. Insulating layers 125 and 127 may be formed from the same or different insulating materials. While the example shown in FIG. 2 employs five floating gates 140, more generally any number of floating gates may be employed.

A metal layer 160 is formed over the exposed surfaces of the conductive material 140 and the first epitaxial layer 100A. A Schottky contact is formed at the interface between the metal layer 160 and the first epitaxial layer 100A. An anode metal 165 is formed over the metal layer 160. A cathode electrode 170 is located on the backside of the semiconductor substrate 100B.

Figure 3A:
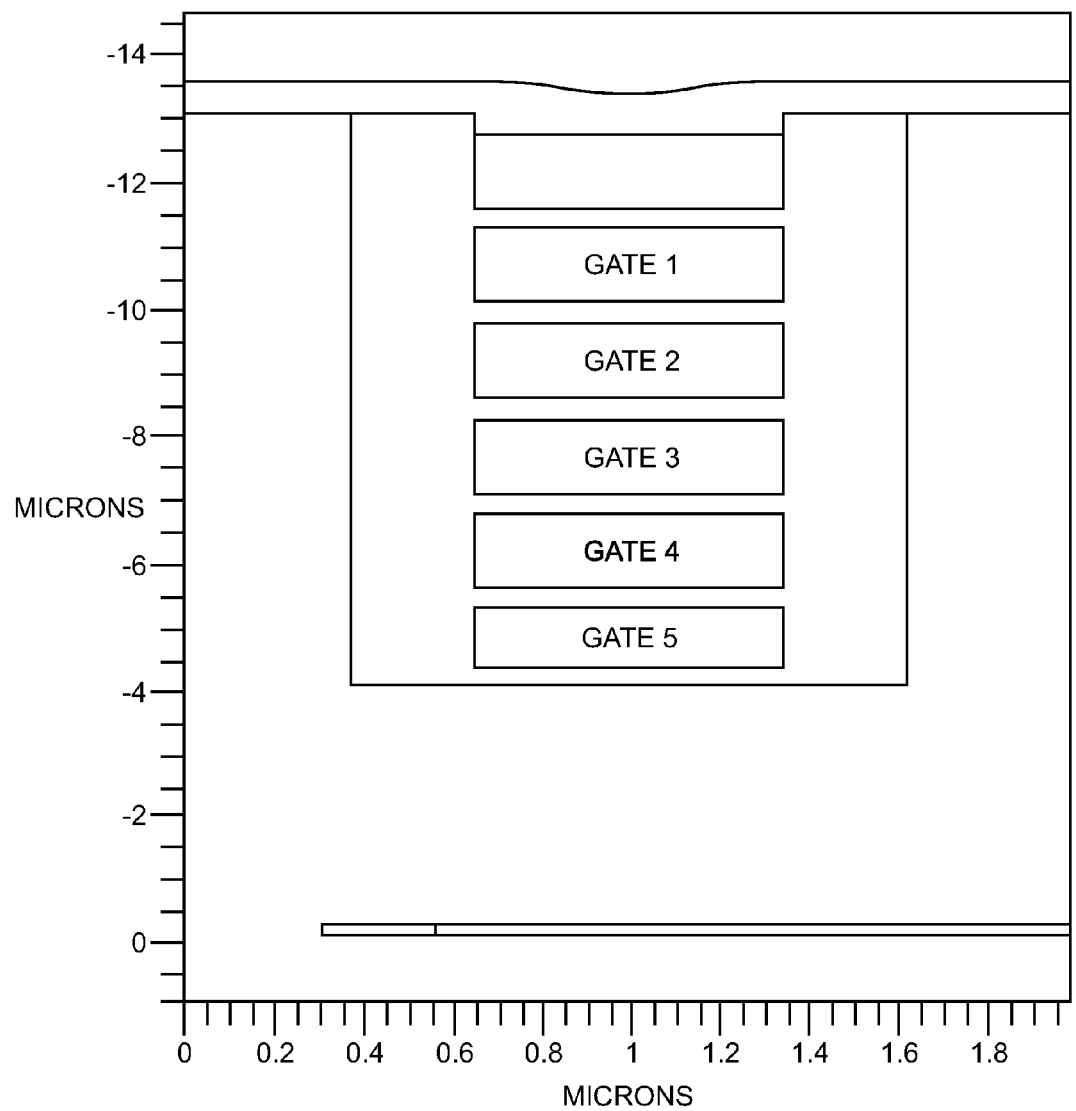
FIGS. 3a and 3b respectively show a cross-sectional view through a TMBS diode with five floating gates and a TMBS diode with only a single gate.
Figure 3B:
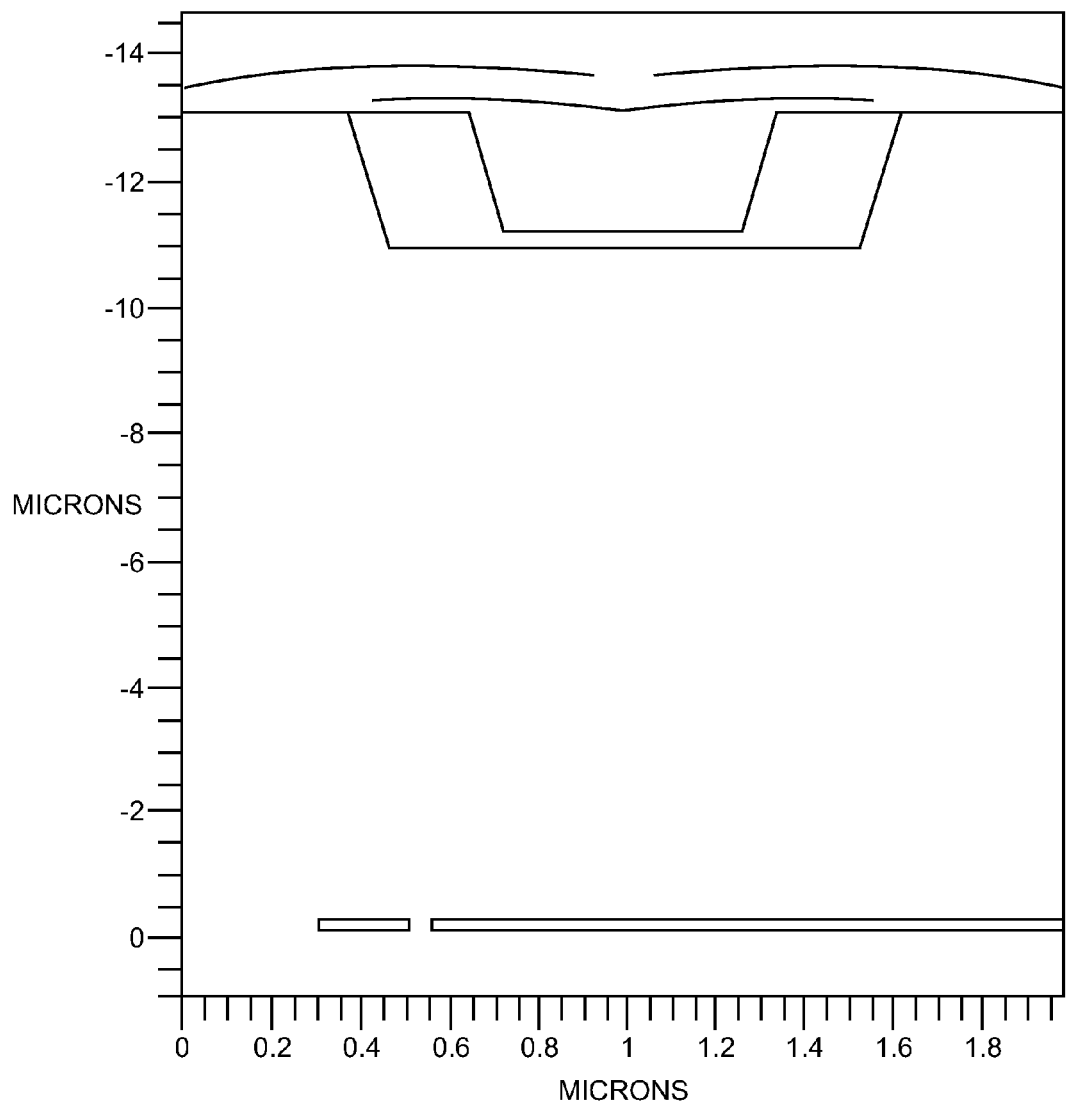
Figure 3C:
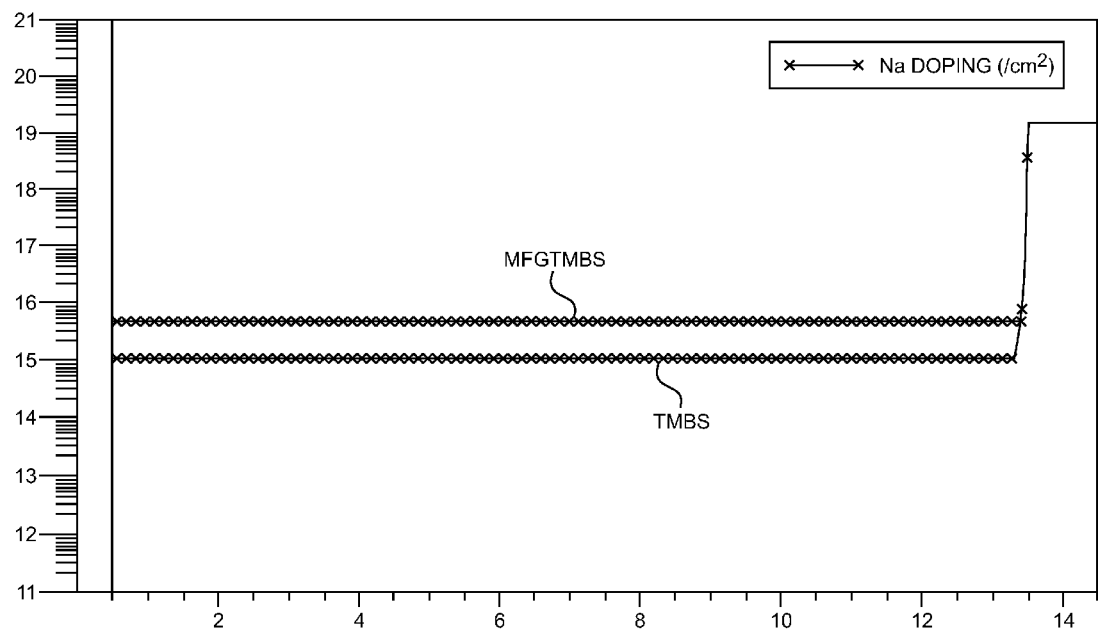
FIG. 3c shows the spreading resistance profile (SPR) for both of the diodes shown in FIGS. 3a and 3b.

Simulations have been performed to illustrate the performance characteristics of a TMBS with multiple floating gates. For instance, FIGS. 3a and 3b respectively show a cross-sectional view through a TMBS diode with five floating gates (as in FIG. 2) and a TMBS diode with only a single gate. FIG. 3c shows the spreading resistance profile (SPR) for both of the diodes shown in FIGS. 3a and 3b.

Figure 4A:
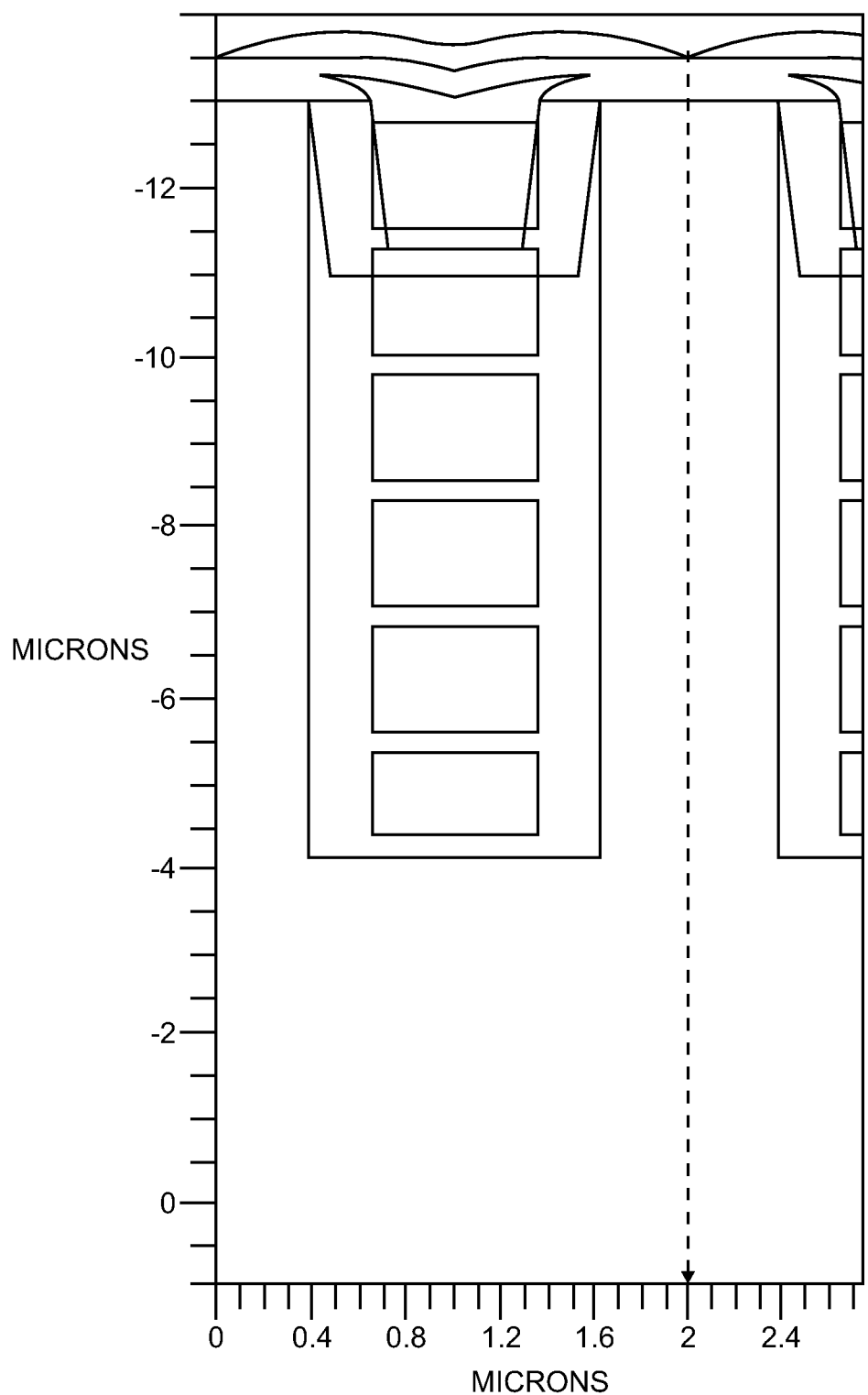
FIG. 4a shows an overlay of a cross-sectional view through a MFGTMBS diode with five floating gates and a TMBS diode with only a single gate.
Figure 4B:
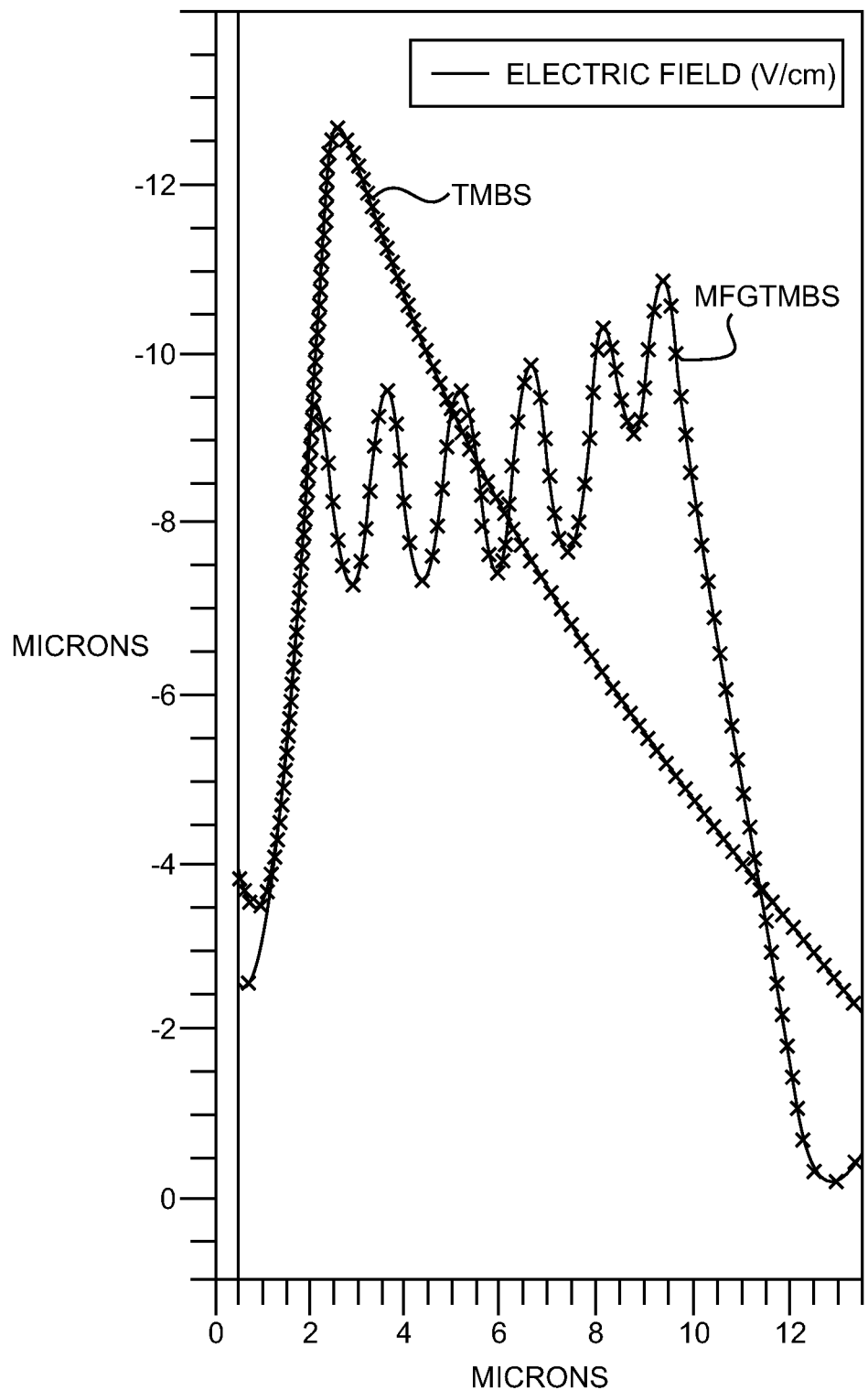
FIG. 4b shows the electric field distribution in both diodes of FIG. 4a when they are reverse biased at 200V.

FIG. 4a shows an overlay of a cross-sectional view through a MFGTMBS diode with five floating gates and a TMBS diode with only a single gate. FIG. 4b shows the electric field distribution in both diodes of FIG. 4a when they are reverse biased at 200V. As shown, the single gate TMBS diode has a single electric field peak. However, the MFGTMBS diode is able to redistribute the electric field through charge coupling and field crowding at the corner of each floating gate to create multiple peaks in the electric field. As previously mentioned, in this way a super junction-like electric field is created, resulting in a device with a higher blocking voltage capability because a more highly-doped epitaxial layer can be used. For instance, whereas a single gate TMBS diode may have a dopant concentration in the epitaxial layer of about $1 \times 10^{15}/cm^3$, in some embodiments of same voltage rated MFGTMBS diode with five floating gates may have a dopant concentration in the epitaxial layer of about $5 \times 10^{15}/cm^3$.

By relocating the electric field, the more highly doped epitaxial layer will also result in an improvement in the forward voltage of the device. While, the same reverse blocking voltage can be achieved in both TMBS and MFGTMBS devices, in the case of the MFGTMBS diode it can be accomplished with a device that has upwards of a 70% reduction in chip size.

Simulations have also shown that the leakage current density in the MFGTMBS diode is greater than for the single gate TMBS diode when the mesa width is greater than about 1.5 microns. However, the actual total leakage current of a MFGTMBS diode with a mesa width of less than about 2 microns is not greater than the actual total leakage current of the single gate TMBS diode. For example, though the JR of the MFGTMBS diode with a mesa width of 1.5 microns is $2.2 \times 10^{-11}$ $A/\mu m^2$, which is higher than the value of $1.5 \times 10^{-11}$ $A/\mu m^2$ for a 200V single gate TMBS diode, its silicon usage is only 40% that of the single gate TMBS diode. For instance, with a target forward voltage of 0.6V the total leakage current of the MFGTMBS diode will be $(2.2 \times 10^{-11}) \times (0.4) = 8.8 \times 10^{-12}$ $A/\mu m^2$, which is lower than the value of $(1.5 \times 10^{-11}) \times (1.0)$ $A/\mu m^2$ for the 200V single gate TMBS diode.

In a single gate TMBS diode the leakage current can be controlled by adjusting the depth of the gate. Because the major contribution to Schottky leakage is believed to be barrier lowering, the leakage current of the MFGTMBS diode can be reduced by increasing the depth of the first floating gate, which will help reduce the surface electric field. Finally, the switching performance of the MFGTMBS diode is expected to be better than for the 200V single gate TMBS because there are fewer minority carriers when operating in forward conductance due to the higher concentration of majority carriers. As a result the switching speed should be much faster. In fact, the switching performance of a 200V MFGTMBS diode should be similar to the switching performance of a 100V single gate TMBS.

Additional simulations have demonstrated that the width of the mesa in a MFGTMBS diode can be varied to produce a trade-off between the reverse and forward performance of the device, similar to the trade-off that arises in a single gate TMBS.

One example of a method that may be employed to form the MFGTMBS diode of FIG. 2 will be described with reference to FIGS. 5-15.

Figure 5:
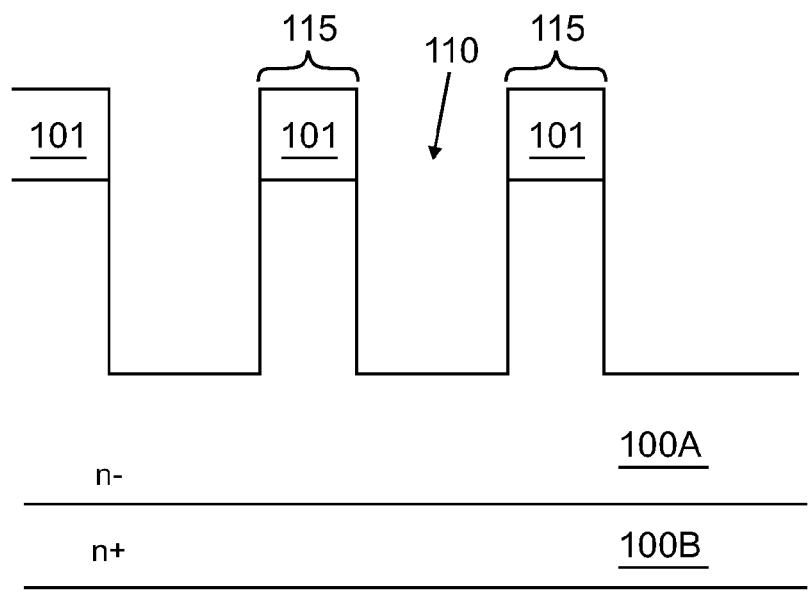
FIGS. 5-15 illustrate one example of the process steps that may be employed to fabricate the device of FIG. 2.

FIG. 5 is a cross-sectional view of a semiconductor substrate 100 that includes a first layer 100A having a dopant of a first conductivity type (e.g., n– type) and a base substrate 100B which is more heavily doped with a dopant of the first conductivity type (e.g., n+ type). An oxide layer 101 is formed on the first substrate 100A by chemical vapor deposition (CVD), for example, to a thickness of about 2000-10,000 angstroms. Next, a photoresist (not shown) is coated on the oxide layer 101 to define a plurality of trenches 110. The trenches 110 are spaced apart from one another by mesas 115.

Figure 6:
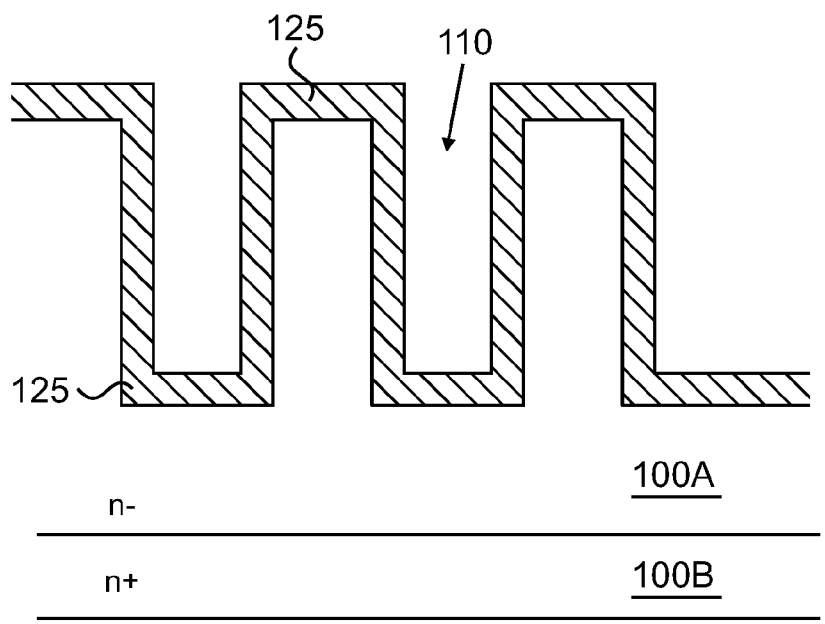

Referring to FIG. 6, after removal of the oxide layer 101, a high temperature oxidation process is performed to form gate oxide layer 125. The gate oxide layer 125, which in some examples has a thickness between about 150 angstroms and 3000 angstroms, is formed on the sidewalls 110A and bottoms 110B of the trenches and the surface of mesa 115 (see FIG. 7). Instead of an oxidation process, the gate oxide layer 125 may be formed by a CVD oxide layer.

Figure 7:
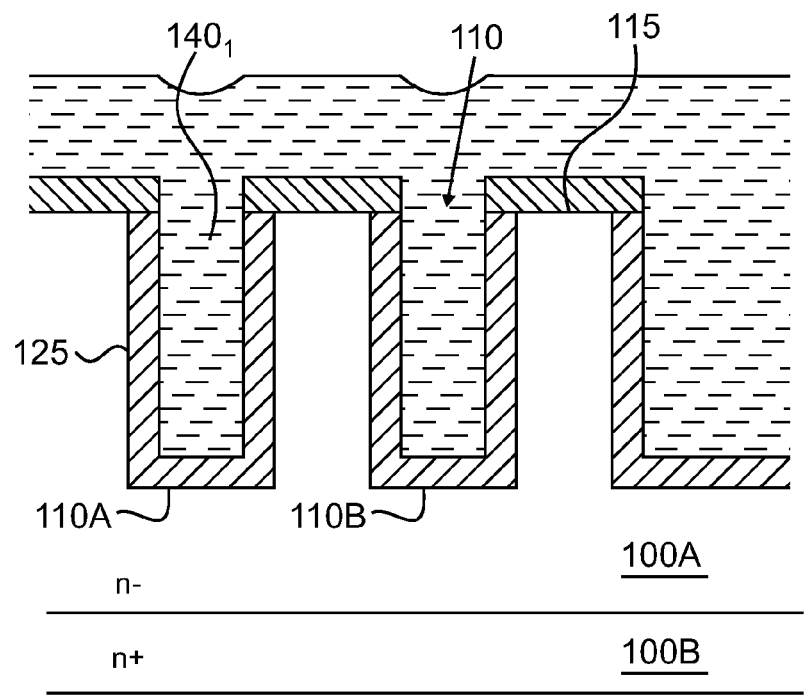

Next, as shown in FIG. 7, a first conductive layer $140_1$ is formed by CVD on the gate oxide 125 and fills the trenches 110. The first conductive layer $140_1$ may be any suitable material such as a metal, doped-polysilicon or doped-amorphous silicon. In one particular embodiment the first conductive layer 140 is Al. In some embodiments the first conductive layer $140_1$ may have a thickness of about 0.1 to 5 microns.

Figure 8:
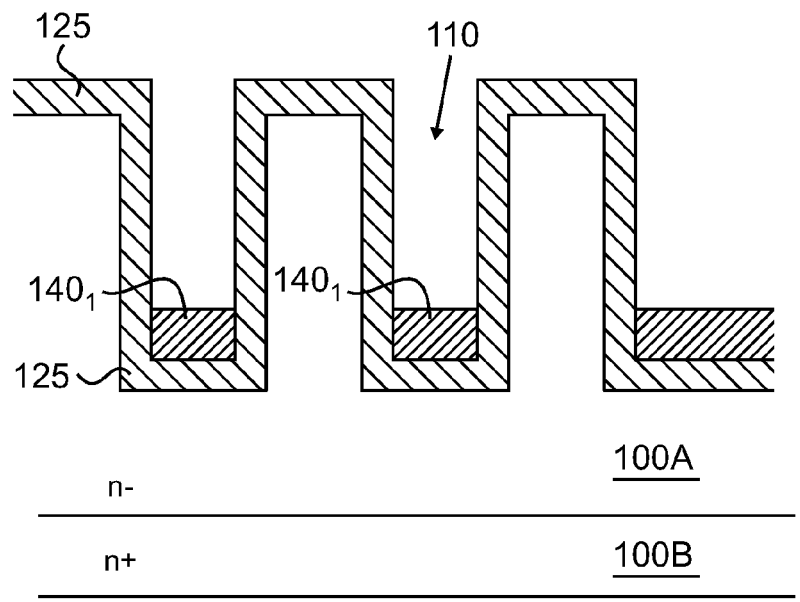
Figure 9:
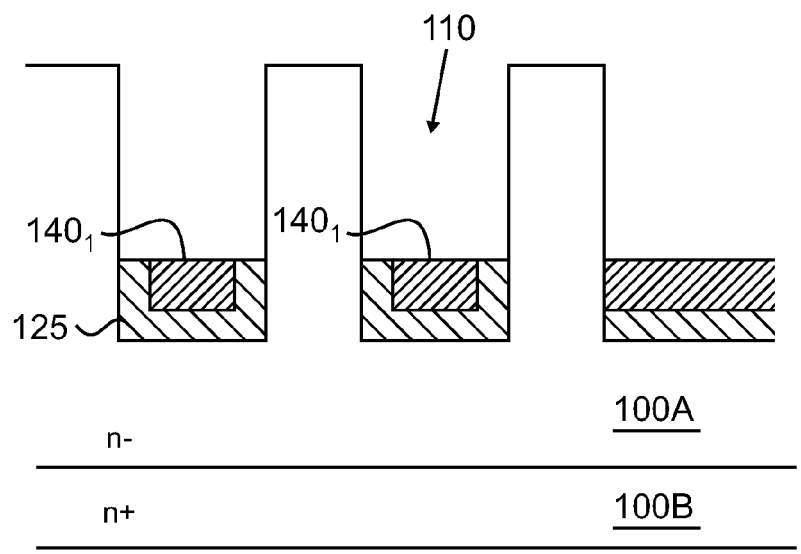
Figure 10:
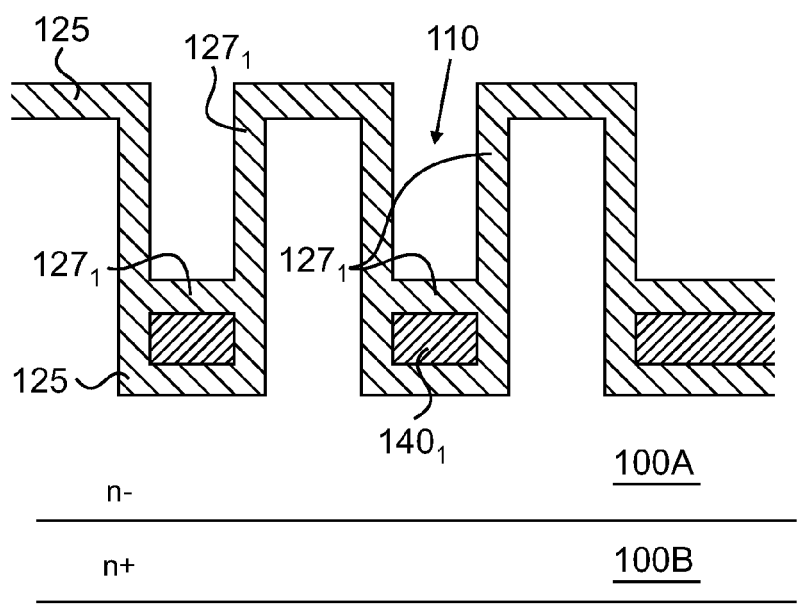
Figure 11:
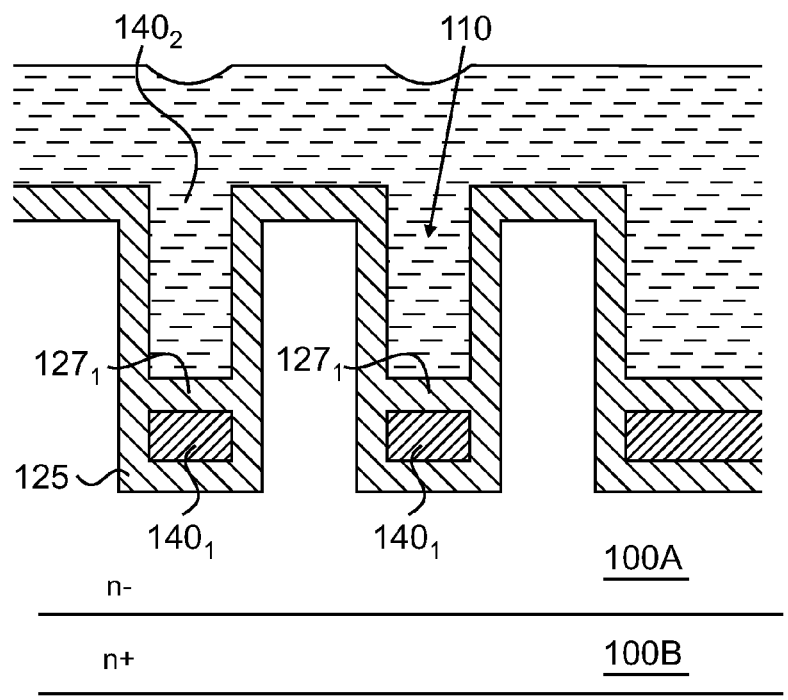
Figure 12:
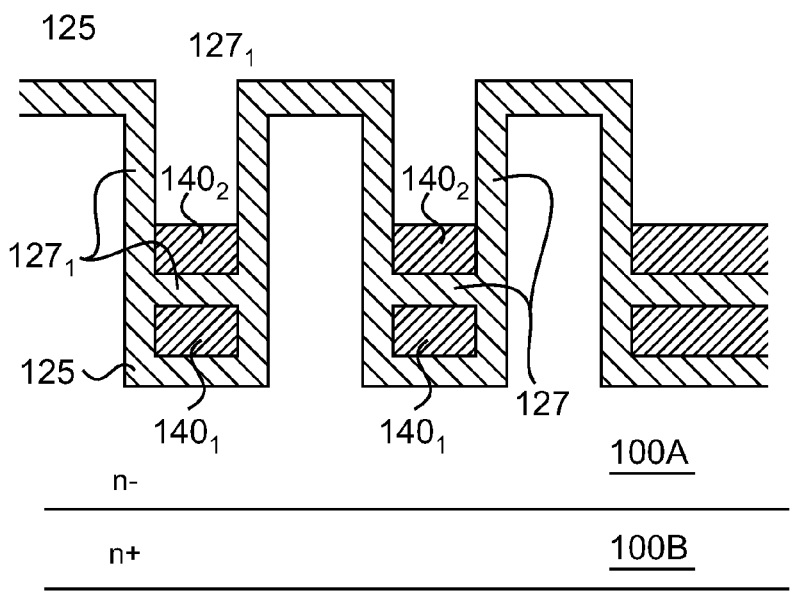
Figure 13:
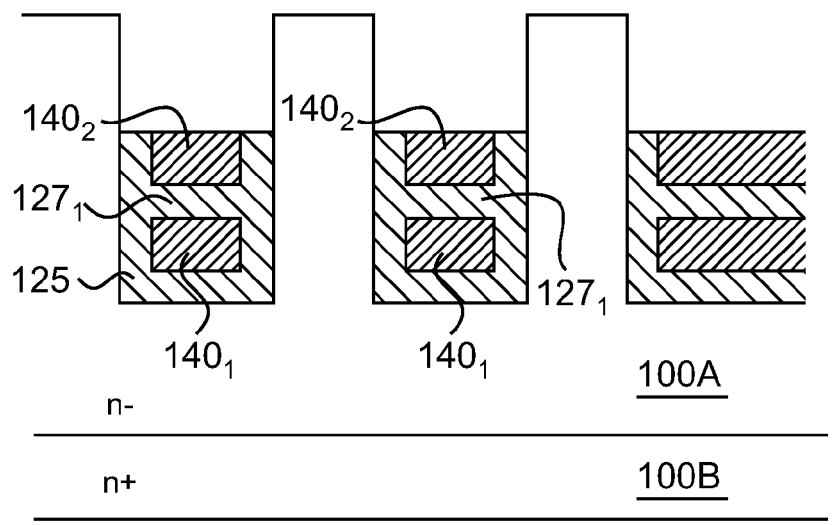
Figure 14:
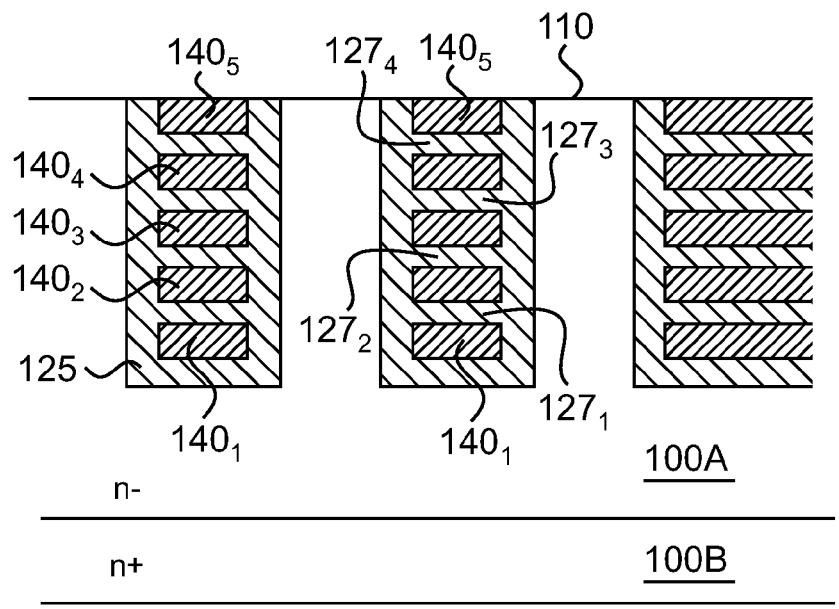

Referring now to FIG. 8, an anisotropic etching is performed to remove the excess first conductive layer 1401 from within the trenches 110. Likewise, in FIG. 9, the gate oxide layer 125 is etched so that its upper surface is largely coplanar with the upper surface of the first conductive layer $140_1$. After this etching process, in FIG. 10 a first dielectric layer $127_1$ is formed in the trenches 110 over the first conductive layer $140_1$. The dielectric layer 127 may be formed from any suitable material such as $SiO_2$, for example. The first dielectric layer $127_1$ is then anisotropically etched to reduce its thickness over the first conductive layer $140_1$. In some embodiments the first dielectric layer 127 may be reduced to a thickness of between 0.2 and 2 microns The first conductive layer $140_1$ serves as the first floating gate shown in FIG. 2. The process shown in FIGS. 7-9 is repeated for each additional floating gate that is to be formed. For instance, in FIG. 11 a second conductive layer $140_2$ is formed over the first dielectric layer $127_1$ and etched back in FIG. 12. Next, as shown in FIG. 13 (and similar to FIG. 9), the first dielectric layer $127_1$ is etched so that its upper surface is largely co-planar with the upper surface of the second conductive layer $140_2$. FIG. 14 shows the result after 5 conductive layers $140_1$-$140_5$ have been formed.

Figure 15:
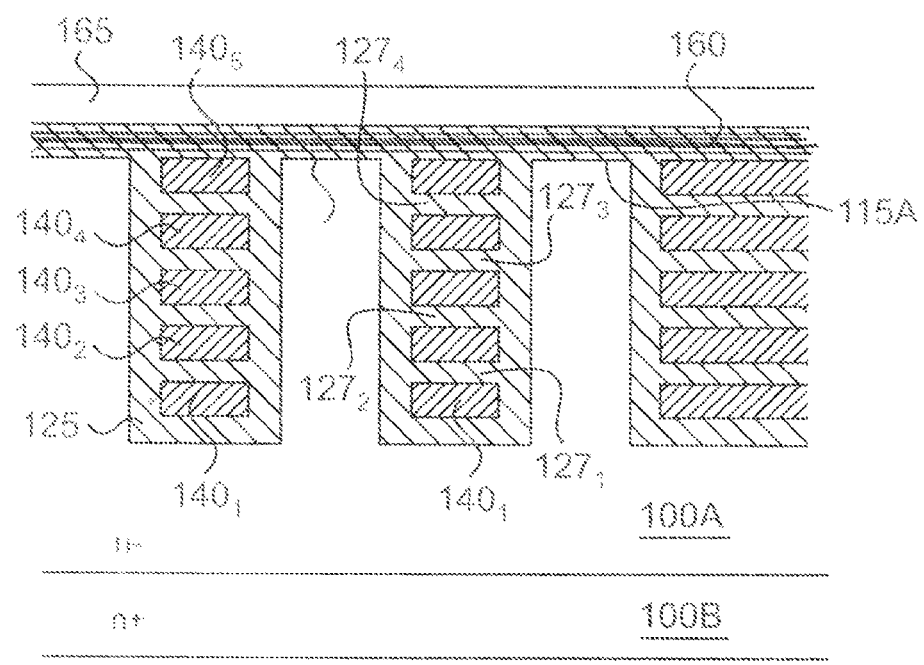

Next, in FIG. 15, after formation of the floating gates, a sputtering or other suitable process is performed to deposit a conductive layer 160 so as to form Schottky contact regions 115A on mesas 115. The conductive layer 160 may be formed from any material that can form a Schottky diode with the underlying first layer 100A. For example, conductive layer 160 may be a metal silicide layer.

The method continues by depositing and etching a conductor to form the diode anode electrode 165, which may co-extensive with conductive layer 160. Likewise a cathode electrode 170 is formed on the backside of substrate 100B.

The above examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

The invention claimed is:

1. A semiconductor rectifier, comprising:
  a semiconductor substrate having a first type of conductivity;
  an epitaxial layer formed on the substrate having the first type of conductivity and being more lightly doped than the substrate;
  a plurality of floating gates formed in the epitaxial layer;
  a metal layer disposed over the epitaxial layer;
  a Schottky contact formed at an interface between the metal layer and the epitaxial layer; and
  a first electrode formed over the metal layer and a second electrode formed on a backside of the substrate.

2. The semiconductor rectifier of claim 1 wherein the plurality of floating gates are disposed in at least one trench formed in the epitaxial layer.

3. The semiconductor rectifier of claim 2 further comprising an insulating layer lining a bottom and sidewalls of the trench.

4. The semiconductor rectifier of claim 1 further comprising a plurality of dielectric layers disposed in the trench, wherein the plurality of floating gates includes a plurality of conducting layers each interposed between adjacent dielectric layers.

5. The semiconductor rectifier of claim 4 wherein the plurality of conducting layers is a plurality of Al layers.

6. The semiconductor rectifier of claim 4 wherein the plurality of conducting layers is a plurality of doped polysilicon layers.

7. The semiconductor rectifier of claim 1 wherein the metal layer is nickel and the epitaxial layer include silicon so that a silicide layer is formed at an interface between the nickel and epitaxial layers.

8. A method of fabricating a rectifier comprising:
  providing a semiconductor body of a first conductivity type;
  etching a plurality of trenches in a surface of the semiconductor body so that a mesa remains between adjacent trenches, each of the trenches having a sidewall and a bottom;
  forming a plurality of floating gates in each of the trenches; and
  forming a metal layer on a surface of the mesa so that a Schottky contact is formed therewith.

9. The method of claim 8 wherein the semiconductor body includes a semiconductor substrate having a first conductivity type and an epitaxial layer formed on the substrate having the first type of conductivity and being more lightly doped than the substrate.

10. The method of claim 8 wherein forming the plurality of floating gates in each of the trenches includes forming a plurality of alternating layers of a dielectric material and a conductive material in each of the trenches.

11. The method of claim 10 wherein forming each of the plurality of alternating layers includes depositing and etching back the dielectric material or the conductive material.

12. The method of claim 10 wherein the conductive material is Al.

13. The method of claim 10 wherein the conductive material is doped polysilicon.

14. The method of claim 8 wherein the metal layer is nickel and the epitaxial layer include silicon so that a silicide layer is formed at an interface between the nickel and epitaxial layers.

* * * * *